United States Patent
Schreiber (10) Patent No.: US 10,331,196 B2
(45) Date of Patent: Jun. 25, 2019

(54) REDUCED SETUP TIME CLOCK GATING CIRCUIT

(71) Applicant: Advanced Micro Devices, Inc., Sunnyvale, CA (US)

(72) Inventor: Russell Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 54 days.

(21) Appl. No.: 15/626,847

(22) Filed: Jun. 19, 2017

(65) Prior Publication Data

US 2018/0364781 A1   Dec. 20, 2018

(51) Int. Cl.
| G06F 1/324 | (2019.01) |
| H03K 5/159 | (2006.01) |
| G06F 1/3296 | (2019.01) |
| G06F 1/3287 | (2019.01) |

(52) U.S. Cl.
CPC ............ *G06F 1/324* (2013.01); *G06F 1/3287* (2013.01); *G06F 1/3296* (2013.01); *H03K 5/159* (2013.01)

(58) Field of Classification Search
CPC ...... G06F 1/324; G06F 1/3287; G06F 1/3296; H03K 5/159
See application file for complete search history.

(56) References Cited

U.S. PATENT DOCUMENTS

| 6,181,180 B1* | 1/2001 | Chen ...................... H03K 3/012 327/211 |
| 7,417,465 B2 | 8/2008 | Lundberg et al. |
| 8,013,649 B2 | 9/2011 | Duncan |
| 9,966,958 B2 | 5/2018 | Bunce et al. |

* cited by examiner

*Primary Examiner* — Austin Hicks
(74) *Attorney, Agent, or Firm* — Meyertons Hood Kivlin Kowert and Goetzel PC; Rory D. Rankin (57) ABSTRACT

A system and method for providing efficient clock gating capability for functional units are described. A functional unit uses a clock gating circuit for power management. A setup time of a single device propagation delay is provided for a received enable signal. When each of a clock signal, the enable signal and a delayed clock signal is asserted, an evaluate node of the clock gating circuit is discharged. When each of the clock signal and a second clock signal is asserted and the enable signal is negated, the evaluate node is left floating for a duration equal to the hold time. Afterward, the devices in a delayed onset keeper are turned on and the evaluate node has a path to the power supply. When the clock signal is negated, the evaluate node is precharged.

17 Claims, 4 Drawing Sheets

REDUCED SETUP TIME CLOCK GATING CIRCUIT

BACKGROUND

Description of the Relevant Art

The power consumption of modern semiconductor chips is based on various parameters, such as the switching of nodes on the chip, operational frequency, load capacitance, operational voltage of the chip, and so on. In order to reduce power consumption, one or more of these parameters are reduced. In various embodiments, power-performance states (P-states) are used to set the operational frequency and operational voltage of the chip while attempting to balance performance and power consumption.

In addition to using P-states, in various embodiments, one or more core states (C-states), such as an active state, an idle state, and a sleep state, are also selected during chip operation. One or more functional units, such as data processing units, data storage units, interface communication units and so on, are capable of being placed in one of multiple levels of idle operation where a particular portion of the functional unit is disabled or placed in a reduced power or performance state. Circuits that are widely used across the chip are prioritized for investigating power reduction techniques. For example, sequential elements such as flip-flop circuits and latch circuits in addition to data storage blocks, such as arrays and queues, are used for retaining state and data throughout the chip. The number of these types of circuits in a given chip may reach the hundreds of thousands in modern designs. The internal nodes of these circuits switch every clock cycle and, therefore, contribute to the total power consumption of the chip. One method of reducing the power consumption of these circuits is by reducing node capacitance through transistor sizing and layout.

Another method to reduce the power consumption of circuits is to use conditional techniques. These techniques disable the clock signal to these circuits. However, meeting setup and hold times for enable signals used to gate clock signals has become difficult as clock frequencies increase.

In view of the above, efficient methods and systems for providing efficient clock gating capability for functional units are desired.

BRIEF DESCRIPTION OF THE DRAWINGS

The advantages of the methods and mechanisms described herein may be better understood by referring to the following description in conjunction with the accompanying drawings, in which.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for providing efficient clock gating capability in circuits are contemplated. A semiconductor chip uses one or more functional units for data processing, data storage and interface communication. In various embodiments, the one or more functional units include an interface for receiving a clock signal to be used by various circuit elements (e.g., sequential elements, word line drivers, and so on). In addition, the interface receives an enable signal for enabling and disabling the clock signal used by the circuit elements and so on. One or more clock gating circuits are used within the circuitry for power management and each clock gating circuit receives the clock signal and the enable signal. The clock gating circuit provides a relatively small setup time for the received enabled signal. In some embodiments, the setup time is a propagation delay through a single device, such as a single transistor. The clock gating circuit generates an output signal, which is a gated clock signal, from each of the received clock signal and the received enable signal. An evaluate node within the clock gating circuit is the last node to be evaluated prior to the output signal, which is the gated clock signal. In various embodiments, the clock gating circuit generates an inverted value of the evaluate node to be used as the gated clock signal.

In various embodiments, the clock gating circuit uses three serially connected transistors between the evaluate node and a ground reference. In some embodiments, the transistors are nmos transistors. In an embodiment, the top nmos transistor has a drain terminal connected to the evaluate node and receives the clock signal on its gate terminal. The middle nmos transistor has a drain terminal connected to the source terminal of the top nmos transistor and receives the enable signal on its gate terminal. The bottom nmos transistor has a drain terminal connected to the source terminal of the middle nmos transistor and receives on its gate terminal a second clock signal, which is a delayed and inverted value of the received clock signal. In addition, the bottom nmos transistor has its source terminal connected to a ground reference. In some embodiments, the second clock signal, which is the delayed and inverted value of the received clock signal, is generated by three serially connected inverters. The amount of delay between the clock signal and the second clock signal provides a hold time for the clock gating circuit. When the clock gating circuit determines each of the clock signal, the enable signal and the second clock signal is asserted, the clock gating circuit discharges the evaluate node through each of the three nmos transistors.

After the hold time, the three serially connected nmos transistors no longer provide a path to the ground reference for the evaluate node since the bottom nmos transistor is turned off by the second clock signal. However, in an embodiment, a fourth transistor (e.g., an nmos transistor) is connected in parallel with the middle and bottom nmos transistors which provides a path to the ground reference for the evaluate node for the remainder of an evaluate stage. In various embodiments, the clock gating circuit uses each of a precharge stage and the evaluate stage in a clock cycle for setting a value on the evaluate node. The fourth nmos transistor receives an inverted value of the evaluate node on its gate terminal. When the clock gating circuit detects each of the clock signal and the enable signal is asserted and the second clock signal is negated (after the hold time), the clock gating circuit provides a path from the evaluate node to the ground reference through the fourth nmos transistor.

In an embodiment, prior to the hold time being reached, when the clock gating circuit determines both of the first clock signal (the received input clock signal) and the second clock signal are asserted and the enable signal is negated, the clock gating circuit allows the evaluate node to float with a precharged value. In such a case, the second clock signal is again a delayed and inverted value of the first clock signal and the second clock signal is received on the gate terminal of the bottom nmos transistor in the clock gating circuit. After the hold time, in some embodiments, the clock gating circuit charges the evaluate node through each of a fifth transistor and a sixth transistor. In various embodiments, the fifth transistor and the sixth transistor are a first pmos transistor and a second pmos transistor. The first pmos transistor has a gate terminal for receiving an inverted value of the evaluate node and a source terminal connected to a power supply. The second pmos transistor has a gate terminal for receiving the second clock signal, a source terminal connected to the drain of the first pmos transistor, and a drain terminal connected to the evaluate node. When the evaluate stage ends and the clock signal is negated, the precharge stage begins and the evaluate node is precharged. In various embodiments, the clock gating circuit uses a pulse domino NAND gate with a relatively small setup time and a delay element for providing a latch hold time on the received enable signal.

Figure 1:
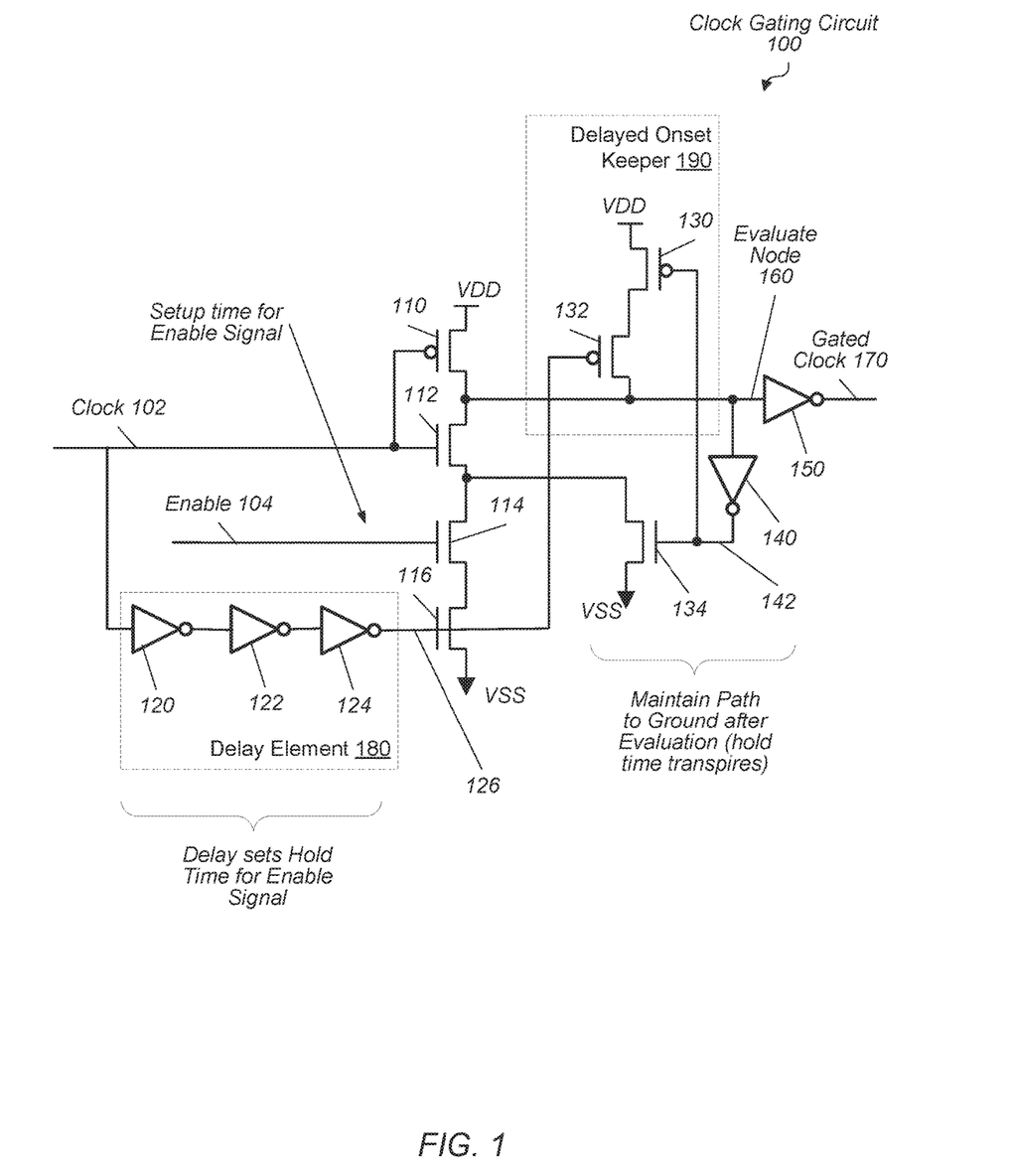
FIG. 1 is a generalized diagram of one embodiment of a clock gating circuit.

Turning now to FIG. 1, a generalized diagram of one embodiment of a clock gating circuit 100 is shown. In various embodiments, the clock gating circuit 100 is used in any of a variety of functional units. In some embodiments, the functional unit is used in a memory. In other embodiments, the functional unit is used in a processing unit. In yet other embodiments, the functional unit is used in an interface block. In various embodiments, the functional unit uses the clock gating circuit 100 to support a power management mechanism in a semiconductor chip.

In various embodiments, the clock gating circuit 100 uses each of a precharge stage and an evaluate stage in a clock cycle for setting a value on the evaluate node 160. The clock gating circuit 100 uses each of the clock signal on node 102 and the enable signal on node 104 to set a value on the evaluate node 160 in addition to inverting the value on node 160 to generate the gated clock signal on node 170. In the embodiment shown, a clock signal is received by a clock node 102 connected to a gate terminal of a precharge device such as the p-type metal oxide semiconductor (MOS) field effect transistor (FET) 110. The source of the pmos transistor 110 is connected to a power supply indicated as "VDD." In some embodiments, the value for the power supply changes based on selected power-performance states (P-states). The drain terminal of the pmos transistor 110 is connected to the evaluate node 160. The evaluate node 160 is inverted by the inverter 150 to provide the gated clock signal on the gated clock node 170. In an embodiment, the clock gated circuit 100 uses domino evaluate circuitry to determine whether to discharge the evaluate node 160 during an evaluate stage. In the illustrated embodiment, the evaluate circuitry uses the serially connected n-type MOSFETs 112, 114 and 116.

The nmos transistor 112 of the evaluate circuitry has a drain terminal connected to the evaluate node 160 and a gate terminal connected to the clock node 102. The nmos transistor 114 has a drain terminal connected to the source terminal of the nmos transistor 112 and a gate terminal connected to the enable node 104 for receiving an enable signal. The nmos transistor 116 has a drain terminal connected to the source terminal of the nmos transistor 114, a gate terminal connected to the node 126, which receives an inverted and delayed value of the clock signal on clock node 102, and a source terminal connected to a ground reference indicated as "VS S."

As shown, the delay element 180 uses the three serially connected inverters 120, 122 and 124. The delay element 180 receives the clock signal on the clock node 102 and provides the inverted and delayed clock signal on node 126. Although in the illustrated embodiment the three serially connected inverters 120, 122 and 124 provide the output on node 126, in other embodiments any of a variety of circuit configurations and logic gates may be used in the delay element 180 to provide the inverted and delayed value of the clock signal on node 102 to be placed on the node 126. The inverted and delayed value of the clock signal on node 102 is referred to as the second clock signal, which is on node 126. In various embodiments, the delay provided by the delay element 180 is the hold time of the clock gating circuit 100. The enable signal on the enable node 104 maintains a value until at least the amount of time equal to the hold time after the rising edge of the clock signal on the clock node 102.

As shown, the inverted and delayed clock signal on node 126 is received both by the nmos transistor 116 of the evaluate circuitry and the pmos transistor 132 of the delayed onset keeper 190. After the clock signal rises on node 102, a delay set by the delay element 180 transpires, and the signal on node 126 falls from a logic high value to a logic low value. The falling value on the node 126 turns off the nmos transistor 116 and removes a path to the ground reference from the evaluate node 160 through the serially connected nmos transistors 112, 114 and 116 when the enable signal on node 104 has a logic high value.

As used herein, when a value reaches a state for enabling evaluation, the value is determined to be asserted. In one example, the clock signal on the clock node 102 having a logic high value enables the circuitry in the clock gating circuit 100 to perform an evaluation stage versus a precharge stage. In such a case, the clock signal on the clock node 102 is determined to be asserted. The logic high value is used as the state in this case to qualify the clock signal as being asserted. In contrast, when the clock signal has a logic low value, the clock signal is determined to be negated since the circuitry in the clock gating circuitry 100 performs the precharge stage versus the evaluation stage. Similarly, the enable signal on the enable node 104 having a logic high value enables the gated clock signal 170 to become asserted. In such a case, the enable signal on the enable node 104 is determined to be asserted. The logic high value is used as the state in this case to qualify the enable signal as being asserted. In contrast, when the enable signal has a logic low value, the enable signal is determined to be negated since the gated clock signal 170 becomes negated and does not allow sequential elements and other clocked circuitry, which receive the gated clock signal 170, to perform evaluation.

In some embodiments, the delayed onset keeper 190 is used to maintain a logic high value on the evaluate node 160 during the evaluate stage when the enable signal has a logic low value on the node 104 (or the enable signal is negated on the node 104). The inverter 140 is used to provide an inverted value of the evaluate node 160 to the gate terminal of the pmos transistor 130. Therefore, when the evaluate node 160 is discharged during the evaluate stage and transitions from a logic high value to a logic low value, the pmos transistor 130 is turned off and the delayed onset keeper 190 does not drive the evaluate node 160.

When the evaluate node 160 is not discharged during the evaluate stage and remains at a logic high value, after the hold time transpires after the rising edge of the clock signal on node 102, both the pmos transistor 130 is turned on and the pmos transistor 132 is turned on. In an embodiment, the hold time is provided by the delay element 180. At this point in time, both pmos transistors 130 and 132 are turned on and the delayed onset keeper 190 drives the evaluate node 160 to maintain a logic high value.

The inverter 140 also provides an inverted value of the evaluate node 160 to the nmos transistor 134, which is also used in the evaluate circuitry. The nmos transistor 134 is used to maintain a path to the ground reference when the hold time transpires. For example, when the evaluate circuitry discharges the evaluate node 160 during the evaluate stage and the hold time transpires, the nmos transistor 116 turns off which removes a path to the ground reference from the evaluate node 160 through the serially connected nmos transistors 112, 114 and 116. However, each of the nmos transistors 112 and 134 are turned on. Therefore, a path to the ground reference is provided from the evaluate node 160 through the nmos transistors 112 and 134.

In another embodiment, when each of the clock signal on node 102 and the second clock signal on node 126 are asserted and the enable signal on node 104 is negated, the evaluate node 160 remains at its precharge value. However, the evaluate node 160 is floating. During this time, each of the nmos transistors 112 and 116 are turned on, but the nmos transistor 114 is turned off. The pmos transistor 130 is turned on, but the pmos transistor 132 is turned off in the delayed onset keeper 190. Similarly, the nmos transistor 134 is turned off. Therefore, there are no drivers for the evaluate node 160 during the evaluate stage when each of the clock signal on node 102 and the second clock signal on node 126 is asserted and the enable signal on node 104 is negated. However, the hold time is not significantly long, so the evaluate node 160 is able to maintain the precharged logical high value during the evaluate stage until the hold time is reached.

As can be seen, in various embodiments, the clock gating circuit 100 uses a pulse domino NAND gate, which receives the clock signal and the enable signal on the nodes 102 and 104, while providing a latch hold time with the delay element 180. The setup time of the clock gating circuit 100 is a relatively small setup time. In an embodiment, the setup time is a propagation delay of the nmos transistor 114. The setup time for the clock gating circuit 100 is the latest time that inputs (e.g., enable signal on enable node 104) can be received and still affect the output on the evaluate node 160 before the evaluate stage ends. In some embodiments, the setup time is any time before a rising edge of the clock signal is received on clock node 102. In other embodiments, the setup time is a non-zero time before the rising edge of the clock signal is received on node 102. In yet other embodiments, an aggressive setup time is a non-zero time after the rising edge of the clock signal is received on the clock node 102. This non-zero time after the rising edge of the clock signal on node 102 is permitted when designers have found through simulations and test circuits that the evaluate node 160 still discharges during the evaluate stage despite the late arriving signal such as the enable signal on the enable node 104. In other embodiments, the enable signal is not allowed to arrive on node 104 after the rising edge of the clock signal on node 102.

Figure 2:
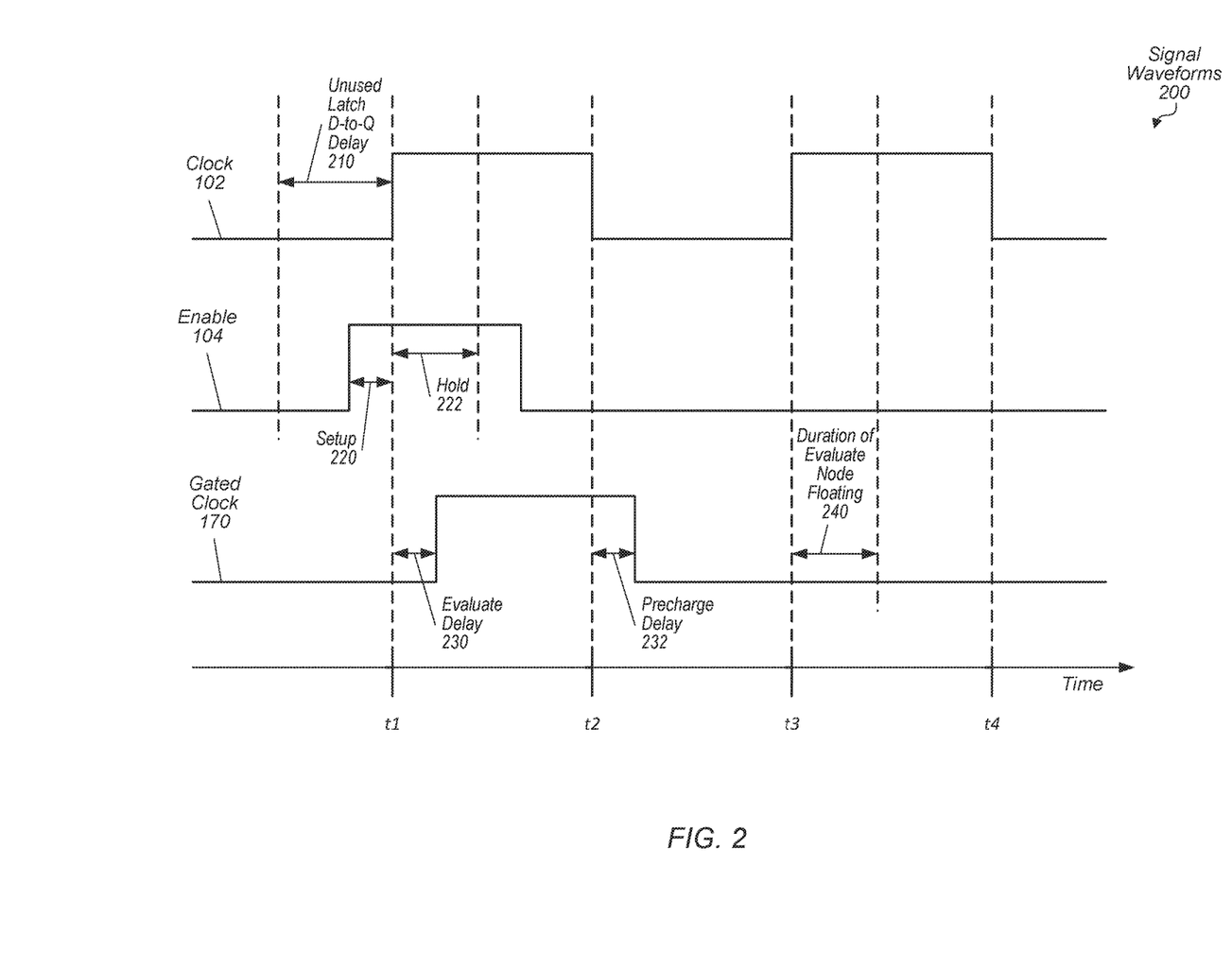
FIG. 2 is a generalized diagram of one embodiment of signal waveforms for clock gating.

Referring now to FIG. 2, a generalized block diagram of one embodiment of memory access signal waveforms 200 over time for clock gating is shown. Signals described earlier are numbered identically. In the illustrated embodiment, the clock signal 102 toggles according to a predetermined frequency. In some embodiments, this frequency is set by a selected P-state. The enable signal 104 is set by control logic used to determine operating modes or states for functional units on a chip. The gated clock signal 170 is a signal resulting from the input signals 102 and 104.

As shown, the non-zero setup time 220 prior to the rising edge of the clock signal 102 is significantly less than a latch D-to-Q delay 210. In some clock gating designs, a latch is used to receive the enable signal 104 and provide it to a complementary NAND logic gate to generate the gated clock signal 170. However, the clock gating circuit 100 described earlier, provides a significantly less setup time 220 while still providing a hold time 222 to prevent glitches on the gated clock signal 170.

At time t1, the rising edge of the clock signal 102 arrives, so the clock signal 102 is asserted. As described earlier, in various embodiments, the second clock signal (not shown) is a delayed and inverted value of the received clock signal 102. The enable signal 104 is already asserted by the setup time 220. In some embodiments, the setup time 220 is the latency through an nmos transistor such as the nmos transistor 114 described earlier for the clock gating circuit 100. An evaluation delay 230 transpires where the rising edge of the gated clock signal 170 is generated. In some embodiments, the evaluation delay is the time to discharge the evaluate node 160 through the nmos transistor 112 in the earlier clock gating circuit 100. For example, if each of the second clock signal and the enable signal 104 is asserted prior to the clock signal 102 becomes asserted, then the nmos transistor 112 has a ground reference on its source terminal. Both during and after the evaluate delay 230, the enable signal 104 is maintained at a logic high value for at least the duration of the hold time 222. In some embodiments, the hold time 222 is set by a delay in the clock gating circuit. As described earlier, in an embodiment, the hold time is set by the delay element 180 used in the clock gating circuit 100.

At time t2, the clock signal 102 transitions to a logic low value, or is negated. The evaluate node is precharged and the gated clock signal 170 is an inverted value of the evaluate node. Therefore, the evaluate node rises and the gated clock signal 170 falls after a precharge delay 232. At time t3, the rising edge of the clock signal 102 arrives again, or the clock signal 102 is asserted again. The enable signal 104 maintains a logic low value in this case, or remains negated. Therefore, the evaluate circuitry does not provide a path to the ground reference for the duration 240. Additionally, the delayed onset keeper does not provide a path to the power supply. Therefore, the evaluate node is floating for the duration 240. In some embodiments, the duration 240 is equal to the hold time 222.

After the duration 240, each of the pmos transistors in the delayed onset keeper is turned on and a path exists from the power supply to the evaluate node. At time t4, the clock signal 102 transitions to a logic low value. The evaluate node is precharged, but the evaluate node already had a logic high value. The gated clock signal 170 is an inverted value of the evaluate node and remains at the logic low value. Therefore, the gated clock signal 170 does not change after the falling edge of the clock signal 102.

Figure 3:
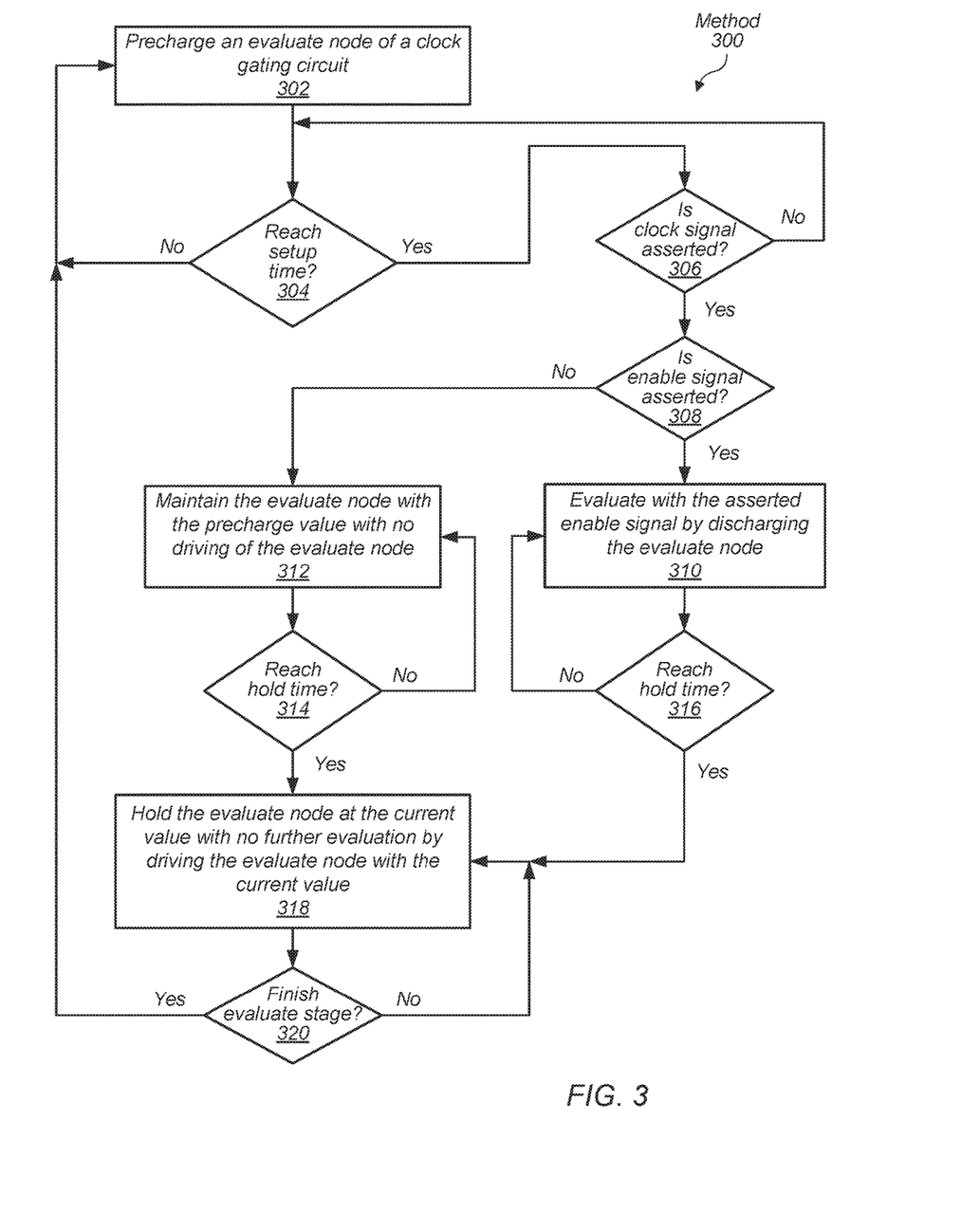
FIG. 3 is a generalized diagram of one embodiment of a method for providing efficient clock gating capability for functional units.

Referring now to FIG. 3, one embodiment of a method 300 for providing efficient clock gating capability for functional units is shown. For purposes of discussion, the steps in this embodiment are shown in sequential order. However, in other embodiments some steps occur in a different order than shown, some steps are performed concurrently, some steps are combined with other steps, and some steps are absent.

In some embodiments, a clock gating circuit uses pulse domino circuitry with latching capability to provide a gated clock signal to one or more sequential elements in addition to word line drivers, sense amplifiers and so on. In an embodiment, the clock gating circuit uses a pulse domino NAND gate with delay elements to provide a latch hold time. Therefore, the setup time is significantly reduced while a hold time ensures storage of the gated clock signal for the corresponding clock phase. An evaluate node of the clock gating circuit is precharged (block 302). For example, in an embodiment, each of the clock signal and the enable signal received by the clock gating circuit has a logic low value, or is negated. In various embodiments, the logic low value for the clock signal indicates a precharge stage rather than an evaluate stage. Therefore, the clock signal is determined to be negated.

The setup time is the latest time that inputs used for circuit evaluation can be received by the circuitry and still affect the output on the evaluate node before the evaluate stage ends. In some embodiments, the setup time is any time before a rising edge of a clock signal is received on a clock input. In other embodiments, the setup time is a determined non-zero time before the rising edge of the clock signal is received on the clock input. In yet other embodiments, an aggressive setup time is a non-zero time after the rising edge of the clock signal is received on the clock input. This non-zero time after the rising edge of the clock signal is permitted when designers have found through simulations and test circuits that the evaluate node still discharges during the evaluate stage despite the late arriving signal such as the enable signal.

If the setup time is not reached ("no" branch of the conditional block 304), then control flow of method 300 returns to block 302 where the evaluate node continues to be precharged. In embodiments where the setup time occurs at or before the rising edge of the clock signal, the evaluate node is precharging since the precharge stage has not yet ended. In other embodiments where the setup time is permitted to occur after the rising edge of the clock signal, the evaluate node continues to be charged to the precharge logic high value due to a keeper device such as a pmos transistor. However, in yet other embodiments where the setup time is permitted to occur after the rising edge of the clock signal, the evaluate node is floating since each of the precharge device (pmos transistor) and delayed onset keeper (serially connected pmos transistors) is not driving the evaluate node.

If the setup time is reached ("yes" branch of the conditional block 304), but the clock signal is not asserted (negated), such as the clock signal has a logic low value ("no" branch of the conditional block 306), then control flow of method 300 returns to conditional block 304. Otherwise, if the clock signal is asserted such as the clock signal has a logic high value ("yes" branch of the conditional block 306), then generating a value for the evaluate node during the evaluate stage is further dependent on the received enable signal.

If the received enable signal is asserted such as the enable signal has a logic high value ("yes" branch of the conditional block 308), then the clock gating circuit evaluates the asserted enable signal by discharging the evaluate node (block 310). In various embodiments, a delayed and inverted value of the clock signal, which is referred to as the second clock signal, is also used and it is asserted. However, if the received enable signal is negated such as the enable signal has a logic low value ("no" branch of the conditional block 308), then the clock gating circuit evaluates the asserted enable signal by maintaining the evaluate node with the precharge value with no driving of the evaluate node (block 312). In an embodiment, the evaluate node is left floating for the duration of a hold time as each of the precharge device (pmos transistor), evaluate circuitry and delayed onset keeper (serially connected pmos transistors) is turned off.

If a hold time is not yet reached ("no" branches of the conditional blocks 314 and 316), then control flow of method 300 returns to a respective one of the blocks 310 and 312. In some embodiments, the hold time is set by three serially connected inverters between the clock node, which receives the clock signal, and a delayed clock node, which provides the inverted and delayed clock signal (second clock signal) to each of the evaluate circuitry and the delayed onset keeper. In other embodiments, any of a variety of circuit configurations and logic gates is used to provide the inverted and delayed clock signal on the inverted and delayed clock node.

Whether the above circuit configuration uses the three serially connected inverters or another configuration, the circuit configuration also sets the hold time of the clock gating circuit since the provided inverted and delayed clock signal disconnects the three serially connected nmos transistors of the evaluate circuitry from the evaluate node. In addition, the inverted and delayed clock signal connects the delayed onset keeper to the evaluate node if the evaluate node was not discharged such as in block 312. If the evaluate node was discharged, such as in block 310, then the delayed onset keeper is disconnected from the evaluate node while a fourth nmos transistor within the evaluate circuitry in a parallel configuration with the bottom two serially connected nmos transistors is turned on between the evaluate node and a ground reference.

If the hold time is reached ("yes" branches of the conditional blocks 314 and 316), then the evaluate node is held at the current value with no further evaluation by driving the evaluate node with the current value (block 318). As described above, the evaluate node is either driven by the delayed onset keeper or by the fourth nmos transistor in the evaluate circuitry. If the clock signal has not yet fallen ("no" branch of the conditional block 320), then the evaluate stage has not yet ended and control flow of method 300 remains at block 318. However, if the clock signal has fallen ("yes" branch of the conditional block 320), then the evaluate stage has ended and control flow of method 300 moves to block 302 where the evaluate node is again precharged.

Figure 4:
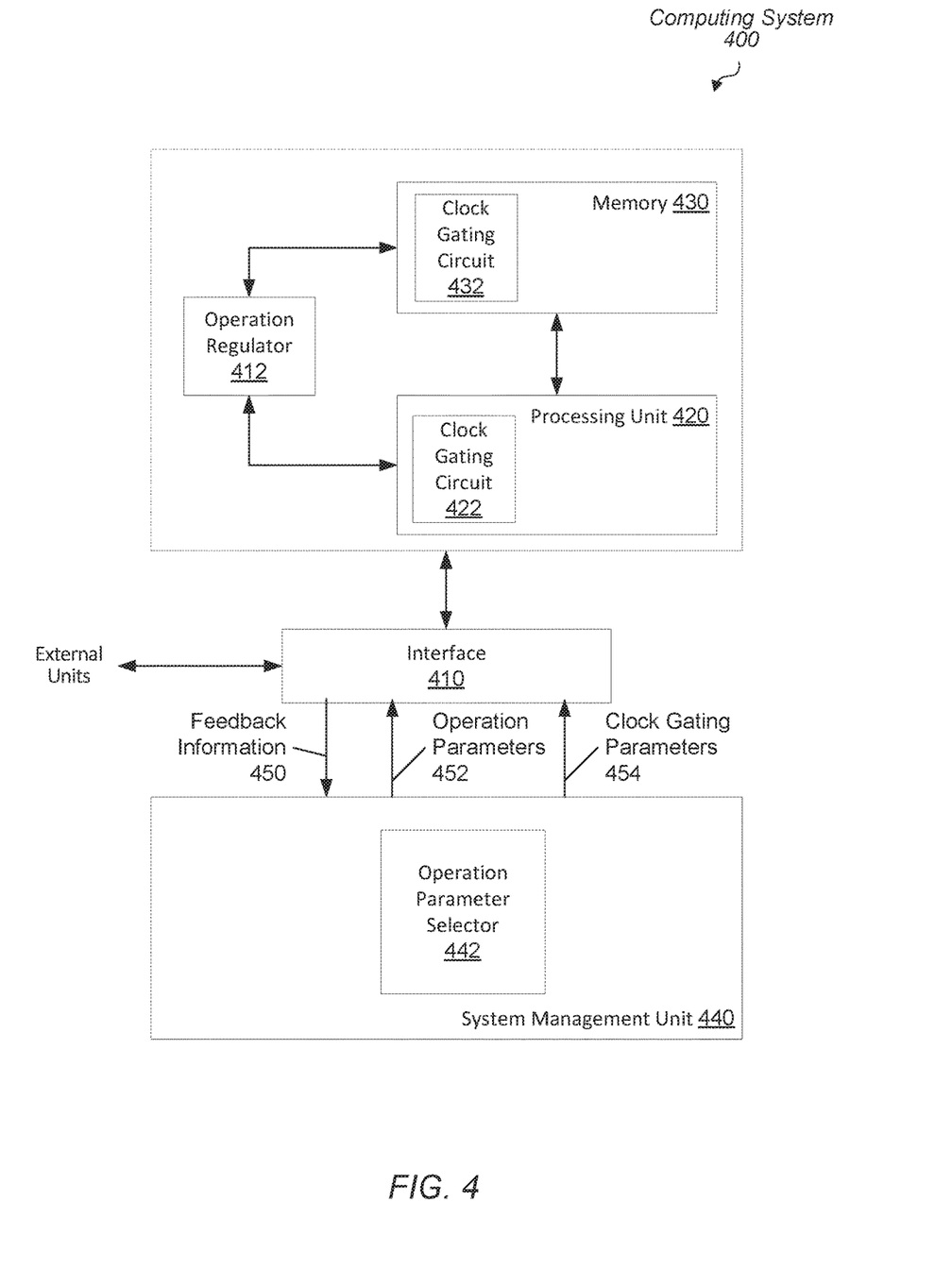
FIG. 4 is a generalized diagram of one embodiment of a computing system.

Turning now to FIG. 4, one embodiment of a computing system 400 is shown. As shown, the computing system 400 includes a processing unit 420, a memory 430, an interface 410, an operation regulator 412 and a system management unit 440. In some embodiments, the functionality of the computing system 400 is included as components on a single die, such as a single integrated circuit. In other embodiments, the functionality of the computing system 400 is included as multiple dies on a system-on-a-chip (SOC). In various embodiments, the computing system 400 is used in a desktop, a portable computer, a mobile device, a server, a peripheral device, or otherwise.

The components of the computing system 400 are capable of using both planar devices (transistors) and non-planar devices. In various embodiments, the interface 410 is used to communicate with other components such as a memory controller, a network interface card (NIC), peripheral devices, and so forth, which are not shown for ease of illustration. The interface unit 410 is also used to transfer messages, data and control signals between the system management unit 440 and each of the processing unit 420 and the memory 430. The control logic in the interface 410 operates according to communication protocols corresponding to each unit transferring information with it. Although not shown, in some embodiments, the interface 410 also uses one or more clock gating circuits as shown for the processing unit 420 and the memory 430.

The processing unit 420 processes instructions of a predetermined algorithm. The processing includes fetching instructions and data, decoding instructions, executing instructions and storing results. In some embodiments, the processing unit 420 is a general-purpose microprocessor. In other embodiments, the processing unit 420 is an application specific integrated circuit (ASIC). In yet other embodiments, the processing unit is a single-instruction-multiple-data (SIMD) microarchitecture processor. In still further embodiments, the processing unit 420 includes the functionality of two or more different architectures such as a general-purpose central processing unit (CPU) and a SIMD processor such as a graphics processing unit (GPU). While processing instructions, the processing unit 420 performs calculations and generates memory access requests for retrieving instructions and operand data and for storing result data. The clock gating circuit 422 is used to enable and disable clock signals to sequential elements and other clock enabled circuitry within the processing unit 420.

In various embodiments, memory 430 represents an entirety of a memory system, a portion of a memory system, is at least a portion of a cache hierarchy, includes a random access memory, or otherwise. These and other embodiments are possible and are contemplated. In yet other embodiments, the memory 430 is a structure embedded within the processing unit 420. For example, the memory 430 may be a patch RAM, a branch instruction prediction table, any of a variety of internal caches (e.g., a translation lookaside buffer, an on-die data or instruction cache), and so on. In various embodiments, the memory 430 includes access control logic in a control unit and an array of memory bit cells arranged in rows and columns. Each of the memory bit cells includes a latching element and a precharging portion for driving values on differential bit lines. The memory 430 is accessed for the fetching operations and the generated memory access requests, which include storing results. Although a single memory is shown, in various embodiments, multiple memories are used in the computing system 400. The clock gating circuit 432 is used to enable and disable clock signals to sequential elements and other clock enabled circuitry, such as word line drivers and sense amplifiers, within the memory 430.

In various embodiments, one or more of the processing unit 420 and the memory 430 receives operating parameters from the operation regulator 412 for operating both logic and circuitry. The operating parameters include at least a combination of an operational frequency and an operational voltage as well as clock enable signals. In some embodiments, one or more of the processing unit 420 and the memory 430 sends feedback information 450 to the operation parameter selector 442 within the system management unit 440. Based on at least the feedback information 450, the operation parameter selector 442 generates control signals and values indicating the operating parameters 452 and the clock gating parameters 454 to be supplied by the operation regulator 412 to the processing unit 420 and the memory 430. Although a single operation regulator 412 is shown, in some embodiments, each of the processing unit 420 and the memory 430 is coupled to a separate and respective operational regulator.

In some embodiments, a power target, such as the thermal design power (TDP), is assigned to the combination of the processing unit 420 and the memory 430. For example, such a TDP may be established based on a determination that the cooling system is able to dissipate the TDP value without exceeding the maximum junction temperature for transistors. In some embodiments, the system management unit 440 associates a total number of power credits with the TDP value and allocates a separate number of power credits to each of the processing unit 420 and the memory 430. A sum of the power credits allocated to the various units generally equals the total number of power credits. Although embodiments where the sum may temporarily exceed the TDP are possible and are contemplated.

In various embodiments, the system management unit 440 adjusts the number of power credits for each of the processing unit 420 and the memory 430 based on the received feedback information 450. Examples of the feedback information 450 are monitored usage information of the processing unit 420 and the memory 430 in addition to on-die sensor values. In some embodiments, the monitored usage information includes one or more of the power credits, weighted activity levels, weighted usage of pre-selected signals, and digital temperature or power calculated values. In some embodiments, one or more of the other examples of the feedback information 450 are converted to power credits within the system management unit 440.

Examples of the on-die sensor values are on-die temperature readings and on-die drawn current readings. In some embodiments, the operation parameter selector 442 receives the feedback information 450 with a known frequency. For example, information is sampled and sensed, calculations are performed and the results are sent to the operation parameter selector 442 during a given time interval. The determination of the time interval is based on a combination of the desired accuracy and confidence of the feedback information 450, and desired results from updated operating parameters 452 found from analysis including simulations and/or executions during production.

While running one or more software applications, the real-time feedback information 450 is conveyed to the operation parameter selector 442, which balances reduced power consumption and increased performance for the computing system 400. In one embodiment, the operation parameter selector 442 selects one discrete power-performance state (P-state) from several given discrete P-states. The combination of operational voltage and clock frequency is referred to as a power-performance state (P-state). In addition, the operation parameter selector 442 selects a C-state from multiple available C-states for each of the processing unit 420 and the memory 430. The C-state indicates one of an active state, one or more idle states, and a sleep state. The C-state is selected by the operation parameter selector 442 using design limits set by at least a thermal design power (TDP) and activity levels of particular functional units.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A clock gating circuit comprising:
   a first transistor with a gate terminal configured to receive a first clock signal and a drain terminal connected to an evaluate node;
   a second transistor with a gate terminal configured to receive an enable signal and a drain terminal connected to a source terminal of the first transistor, wherein a setup time for the enable signal is a propagation delay of the second transistor;
   a third transistor with a gate terminal configured to receive a second clock signal on a delayed clock node, a drain terminal connected to a source terminal of the second transistor, and a source terminal connected to a ground reference, wherein the second clock signal is a delayed and inverted value of the first clock signal;
   a fourth transistor with a gate terminal configured to receive an inverted value of the evaluate node and a source terminal connected to a power supply;
   a fifth transistor with a gate terminal configured to receive the second clock signal, a source terminal connected to the drain of the fifth transistor, and a drain terminal connected to the evaluate node; and
   wherein in response to each of the first clock signal, the enable signal, and the second clock signal being asserted, the clock gating circuit discharges the evaluate node through each of the first transistor, the second transistor and the third transistor.

2. The clock gating circuit as recited in claim 1, wherein in response to each of the first clock signal and the second clock signal being asserted and the enable signal being negated, the evaluate node is floating with a precharged value.

3. The clock gating circuit as recited in claim 2, further comprising a seventh transistor with a gate terminal configured to receive the first clock signal, a source terminal connected to a power supply, and a drain terminal connected to the evaluate node, wherein in response to determining the first clock signal is negated, the seventh transistor is configured to precharge the evaluate node.

4. The clock gating circuit as recited in claim 1, further comprising a sixth transistor with a gate terminal configured to receive an inverted value of the evaluate node, a drain terminal connected to the drain terminal of the second transistor, and a source terminal connected to the ground reference, wherein in response to the first clock signal and the enable signal being asserted and the second clock signal being negated, the sixth transistor is configured to maintain a path from the evaluate node to the ground reference.

5. The clock gating circuit as recited in claim 4, further comprising three serially connected inverters with an input configured to receive the first clock signal and an output configured to convey the second clock signal, wherein the three serially connected inverters set a hold time of the clock gating circuit.

6. The clock gating circuit as recited in claim 1, wherein in response to each of the evaluate node and the second clock signal being asserted, the clock gating circuit is configured to charge the evaluate node through each of the fourth transistor and the fifth transistor.

7. A method comprising:
   receiving a first clock signal on a gate terminal of a first transistor with a drain terminal connected to an evaluate node;
   receiving an enable signal on a gate terminal of a second transistor with a drain terminal connected to a source terminal of the first transistor, wherein a setup time for the enable signal is a propagation delay of the second transistor; and
   receiving a second clock signal on a gate terminal of a third transistor with a drain terminal connected to a source terminal of the second transistor and a source terminal connected to a ground reference, wherein the second clock signal is a delayed and inverted value of the first clock signal;

receiving an inverted value of the evaluate node on a gate terminal of a fourth transistor with a source terminal connected to a power supply;

receiving the second clock signal on a gate terminal of a fifth transistor with a source terminal to the drain of the fifth transistor and a drain terminal connected to the evaluate node; and in response to each of the first clock signal, the enable signal, and the second clock signal being asserted, discharging the evaluate node through each of the first transistor, the second transistor and the third transistor.

8. The method as recited in claim 7, wherein in response to each of the first clock signal and the second clock signal being asserted and the enable signal being negated, the method further comprises floating the evaluate node with a precharged value.

9. The method as recited in claim 8, further comprising receiving the first clock signal on a gate terminal of a seventh transistor with a source terminal connected to a power supply and a drain terminal connected to the evaluate node, wherein in response to determining the first clock signal is negated, the method further comprises precharging the evaluate node through the seventh transistor.

10. The method as recited in claim 7, further comprising receiving an inverted value of the evaluate node on a gate terminal of a sixth transistor with a drain terminal connected to the drain terminal of the second transistor and a source terminal connected to the ground reference, wherein in response to the first clock signal and the enable signal being asserted and the second clock signal being negated, maintaining a path from the evaluate node to the ground reference through the sixth transistor.

11. The method as recited in claim 10, further comprising receiving the first clock signal on an input of three serially connected inverters with an output conveying the second clock signal, wherein the three serially connected inverters set a hold time of the clock gating circuit.

12. The method as recited in claim 7, wherein in response to each of the evaluate node and the second clock signal being asserted, the method further comprises charging the evaluate node through each of the fourth transistor and the fifth transistor.

13. A functional unit in a processor with power management, the functional unit comprising:

an interface configured to receive a first clock signal and an enable signal;

one or more sequential elements configured to receive a gated clock signal; and a clock gating circuit configured to generate the gated clock signal by inverting an evaluate node, wherein the clock gating circuit comprises:

a first transistor with a gate terminal configured to receive the first clock signal and a drain terminal connected to the evaluate node;

a second transistor with a gate terminal configured to receive the enable signal and a drain terminal connected to a source terminal of the first transistor, wherein a setup time for the enable signal is a propagation delay of the second transistor; and a third transistor with a gate terminal configured to receive a second clock signal on a delayed clock node, a drain terminal connected to a source terminal of the second transistor and a source terminal connected to a ground reference, wherein the second clock signal is a delayed and inverted value of the first clock signal; and a fourth transistor with a gate terminal configured to receive an inverted value of the evaluate node and a source terminal connected to a power supply;

a fifth transistor with a gate terminal configured to receive the second clock signal, a source terminal connected to the drain of the fifth transistor and a drain terminal connected to the evaluate node; and wherein in response to each of the first clock signal, the enable signal, and the second clock signal being asserted, the clock gating circuit discharges the evaluate node through each of the first transistor, the second transistor and the third transistor.

14. The functional unit as recited in claim 13, wherein in response to each of the first clock signal and the second clock signal being asserted and the enable signal being negated, the evaluate node is floating with a precharged value.

15. The functional unit as recited in claim 13, wherein the clock gating circuit further comprises a sixth transistor with a gate terminal configured to receive an inverted value of the evaluate node, a drain terminal connected to the drain terminal of the second transistor and a source terminal connected to the ground reference, wherein in response to the first clock signal and the enable signal being asserted and the second clock signal being negated, the sixth transistor is configured to maintain a path from the evaluate node to the ground reference.

16. The functional unit as recited in claim 15, wherein the clock gating circuit further comprises three serially connected inverters with an input connected to the first clock signal and an output connected to provide the second clock signal, wherein the three serially connected inverters set a hold time of the clock gating circuit.

17. The functional unit as recited in claim 13, wherein in response to each of the evaluate node and the second clock signal being asserted, the clock gating circuit is configured to charge the evaluate node through each of the fourth transistor and the fifth transistor.

* * * * *